United States Patent
Tam et al.

(10) Patent No.: US 7,098,738 B2
(45) Date of Patent: Aug. 29, 2006

(54) FINE STEP AND LARGE GAIN RANGE PROGRAMMABLE GAIN AMPLIFIER

(75) Inventors: Derek Hing-Sang Tam, Irvine, CA (US); Ardie Venes, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 116 days.

(21) Appl. No.: 10/744,785

(22) Filed: Dec. 24, 2003

(65) Prior Publication Data

US 2005/0140451 A1 Jun. 30, 2005

(51) Int. Cl.
  *H03G 3/30* (2006.01)
(52) U.S. Cl. ...................................... 330/284
(58) Field of Classification Search ............... 330/254, 330/282, 284; 348/678, 707
  See application file for complete search history.

(56) References Cited

U.S. PATENT DOCUMENTS

| | | | | |
|---|---|---|---|---|
| 4,430,609 | A * | 2/1984 | Van Kessel et al. | 323/350 |
| 6,441,684 | B1 * | 8/2002 | Nakamura | 330/9 |
| 6,445,248 | B1 * | 9/2002 | Gilbert | 330/51 |

OTHER PUBLICATIONS

Phillips Semiconductor, "*TDA9880T Alignment-free Multistandard Vision and FM sound IF-PLL Demodulator*," Product Specification, Nov. 22, 2000, pp. 1-40.
Gilbert, Barrie, "*A Low-Noise Wideband Variable-Gain Amplifer Using an Interpolated Ladder Attenuator*," 1991 IEEE International Solid State Circuits Conference, ISSCC91/Session 17/Analog Techniques/Paper 17.5, pp. 280-281, 330.

* cited by examiner

*Primary Examiner*—Steven J. Mottola
(74) *Attorney, Agent, or Firm*—Sterne, Kessler, Goldstein & Fox, P.L.L.C.

(57) ABSTRACT

A programmable gain amplifier with three stages uses fine steps, has a large gain range, and is monotonic. The first stage comprises several amplifiers, each including a resistive feedback loop. The feedback loop comprises a series of resistors, with each resistor acting as a tap. Since the number of resistors in the loop is unchanging, monotonicity and stability is guaranteed when resistance is increased using successive taps. A switch system connects two taps at a time to an interpolation stage. Each of these taps corresponds to a specific resistor level, and thus a gain level. The interpolation stage uses a plurality of current sources inside a feedback amplifier to control the interpolation, in order to provide fine gain steps.

38 Claims, 15 Drawing Sheets

FIG. 2
(CONVENTIONAL)
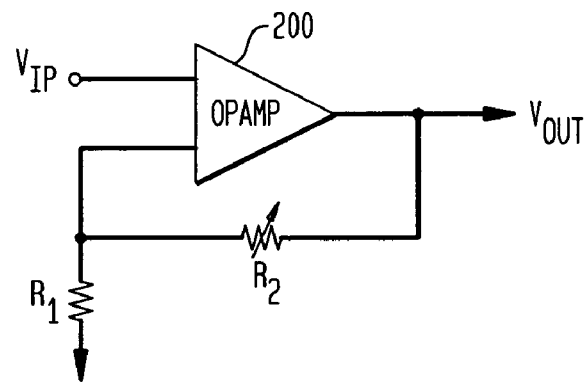

TYPICAL IF DEMODULATOR

FINE STEP AND LARGE GAIN RANGE PROGRAMMABLE GAIN AMPLIFIER

BACKGROUND OF THE INVENTION

1. Field of the Invention

The present invention is related to a programmable gain amplifier, and more specifically to a programmable gain amplifier used in an IF demodulator.

2. Related Art

Programmable gain amplifiers (PGAs) are used in various analog signal processing applications where an electrical signal of varying amplitude must be either amplified or attenuated before subsequent signal processing.

Various gain and/or attenuation settings are required to accommodate the wide dynamic range needed for the amplifier's input stages.

In a typical automatic gain control (AGC) system, a PGA should be monotonic in order to maintain stability for the AGC loop, or simply to ensure the control circuit functions properly.

In an IF demodulator or TV system, a programmable gain amplifier needs to have a large bandwidth to accommodate the high frequency nature of the input signal. An amplifier also needs to have a high signal-to-noise ratio and high linearity to maintain picture quality. Further, an amplifier is needed that will maintain a large gain range with a very small step size.

SUMMARY OF THE INVENTION

In one embodiment, a PGA includes a first stage for providing amplification in coarse steps, a second stage for interpolating the amplification from the first stage to produce amplification in fine steps, and a plurality of switches connecting the first and second stages. The first stage includes several amplifiers and an attenuator. In an embodiment, the first stage may include only an attenuator, a plurality of amplifiers, or both. The attenuator is configured as an R/iR resistive ladder, where 'i' indicates the ratio of the resistor 'R' and resistor 'iR'. 'i' is not necessarily an integer. The R/iR ladder comprises a cascade of resistive divider networks. The size of the resistors are selected such that a fixed attenuation is achieved at each stage, usually in logarithm scale, or in dB. In one embodiment, a 1 dB attenuation between stages is selected. Each stage is connected to a switch as a tap. The taps are connected together as the output of the attenuator. The output attenuation can be selected by closing a switch at a time.

Each amplifier includes a feedback loop including an R/iR resistor ladder, wherein "i" represents the ratio of the resistors in the ladder. When an R/iR resistor ladder is configured inside a feedback loop, amplification can be achieved. In an embodiment, a 1 dB step is selected between the ladder stages. The feedback configuration allows the amplifier to have a high signal-to-noise ratio (SNR) and high linearity. Each resistor is connected to the plurality of switches as a tap. Depending on the resistor value, attenuation or amplification between each tap can be changed. Since there is a fixed amount of total resistance in the feedback loop, monotonicity is guaranteed when a different gain is selected using successive taps inside an amplifier. Besides improving monotonicity, the resistor network is unchanged when using different gain settings, as is the open-loop bandwidth of the amplifer. Hence, loop stability of the amplifier is maintained at all times.

The plurality of switches is broken into two sets of switches. In one embodiment, each set of switches closes only one switch at a time. The second stage accepts the output of two adjacent switches, one from each set of switches. The output of each of the two switches is an input gain signal for the second stage. In the second stage, also called an interpolation stage, a final output gain signal is interpolated between the two input gain signals. To do this, the input gain signals are amplified by corresponding differential amplifiers in the second stage. The differential amplifier is configured in a closed-loop feedback form and with current interpolation inside the feedback loop to provide high linearity, low distortion and high SNR for the signal. A plurality of switchable current sources provide tail current for each of the differential transistor pairs, configured inside a feedback loop, so that the contribution from each input signal is controlled by the number of current sources that are activated for each respective differential pair. As the current through a differential pair is increased, the output from that corresponding pair increases, thus increasing the contribution of the corresponding input signal to the output gain signal of the second stage.

In one embodiment, the gain is changed via a sliding method. In the sliding method, a set of two adjacent switches are closed and the second stage interpolates between the set of two switches. The amount of gain between the two switches is referred to as a "coarse" step. The discrete interpolations produced by the second stage are referred to as "fine" steps. When the maximum gain in a coarse step is reached, the set of two switches is opened, and the next set of two switches is closed. The interpolation then continues between the signals output by the new set of switches. One of the complications with this method is that a glitch enters the output stream when all switches are open due to the transition between coarse steps.

In a preferred embodiment, the gain is changed via a tumbling method. Like the sliding method, two adjacent switches are closed when the tumbling method begins. When the maximum gain in a coarse step is reached, though, the switches in the set of two switches are not both opened. Instead, only the lower switch (if increasing the gain) or the higher switch (if decreasing the gain) is changed at any given time. Since at least one switch is closed at all times, no breaks in the signal occur, and no glitches are inserted into the output signal.

In another embodiment, an amplification system using the PGA described above amplifies a signal partly in analog and partly in digital. In typical systems, an analog-to-digital converter (ADC) can limit the quality of the system because of the signal-to-noise ratio it creates in the system. However, smaller signals can tolerate a smaller SNR, and the ADC ceases to be the limiting factor. If the PGA of the present invention amplifies an input signal until the ADC is a step away from being the limiting factor, the amplified signal can be passed through the ADC without adding any additional noise to the system. The remainder of the desired gain can then be realized using a digital PGA.

BRIEF DESCRIPTION OF THE DRAWINGS/FIGURES

FIG. 2 is a diagram of a conventional op-amp that is typically used in PGAs.

DETAILED DESCRIPTION OF THE INVENTION

Although the examples contained herein typically refer to an increasing gain, one skilled in the art would recognize that the same techniques and systems may be used for decreasing gain.

Figure 1:
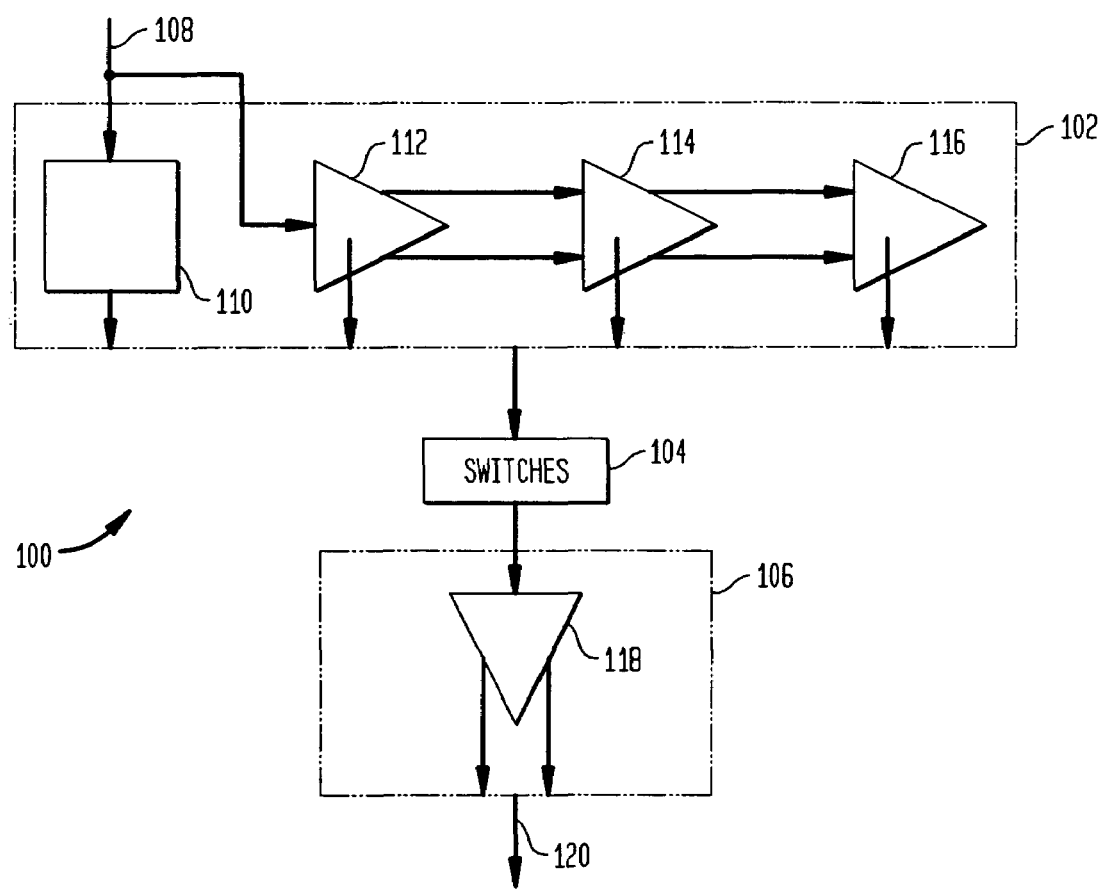
FIG. 1 is a block diagram of a programmable gain amplifier (PGA) according to the present invention.

FIG. 1 is a block diagram of a programmable gain amplifier (PGA) 100 according to the present invention. PGA 100 comprises a first stage 102, a plurality of switches 104, and second stage 106. First stage 102 amplifies or attenuates an input signal 108 in a stepped fashion. In an embodiment, first stage 102 comprises an attenuator 110 and amplifiers 112, 114, and 116.

Although three amplifiers are shown here, additional amplifiers may be added or subtracted. In other words, the system can include attenuators only, amplifiers only, or combinations of both. Attenuator 110 is connected in parallel to amplifier 112 so that input signal 108 is received in parallel. Amplifiers 112, 114, and 116 are connected to each other in series.

In an embodiment, amplifiers 112, 114, and 116 are DC coupled to avoid attenuation between the cascaded stages, as would be caused by, for example, AC coupling. However, DC offset caused by DC coupling will be amplified in each stage by the following stage. To prevent a DC offset, compensation may also be made using, e.g., a compensator (not shown) to remove the offset at the end or throughout the signal path. Output signal 120 is the output from second stage 106.

In a preferred embodiment, attenuator 110 has a 20 dB gain range, specifically, −20–0 dB. Each amplifier has an 8 dB gain range. This produces a total gain range of 44 dB (−20–24 dB) if three amplifiers are used.

In a preferred embodiment, each of attenuator 110 and amplifiers 112–116 have a gain step size of 1 dB. One of skill in the art will recognize that any number of amplifiers may be used. In addition, one of skill in the art will recognize that other gain step sizes may also be used and still be within the scope and spirit of the invention.

Plurality of switches 104 connects the output of first stage 102 to the input of second stage 106.

Second stage 106 comprises a fixed gain amplifier 118 that is configured to provide gain steps as will be discussed further herein and in reference to FIGS. 6A and 6B. In a preferred embodiment, amplifier 118 has a gain range of 8 dB. Second stage 106 interpolates the amplification of signal 108 to break the amplification step size from first stage 106 into smaller steps. Hereinafter, gain steps which take place in first stage 102 will be referred to as "coarse" steps. Similarly, interpolated gain steps which take place in second stage 106 will be referred to as "fine" steps.

Each of these components will now be discussed in detail.

FIG. 2 is a conventional amplifier 200 that is typically used in PGAs. Amplifier 200 is configured as a non-inverting feedback amplifier. The gain of the amplifier is set by the ratio of $R_1$ and $R_2$, or named as the feedback factor. Programmability can be achieved by varying the resistor $R_2$ or varying the feedback factor. As $R_2$ increases, gain also increases. However, the increased resistance also causes a decrease in closed-loop bandwidth. If resistance is increased while the amplifier is operating at the edge of its bandwidth, it is possible that the bandwidth will shrink and no longer support such a wide range. This results in a non-monotonic signal, causing gain to decrease as resistance increases. For this reason, in addition to changing the resistance, the bandwidth would also have to be monitored and changed when increased gain is desired.

Figure 3:
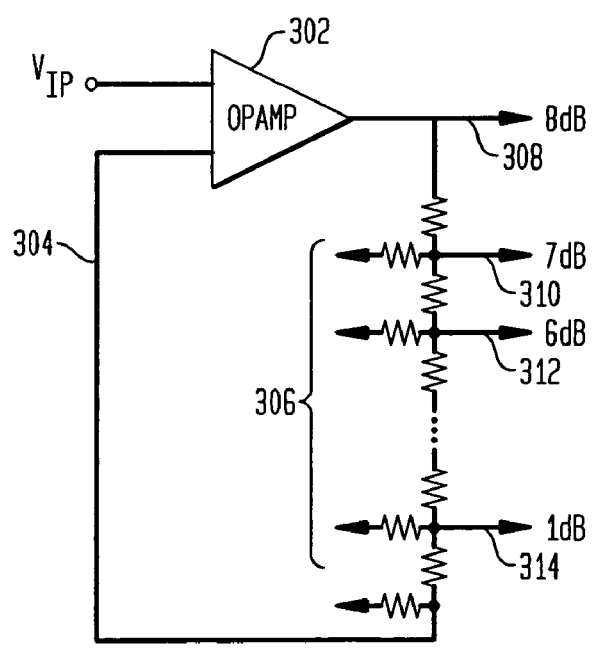
FIG. 3 is a diagram of an example op-amp for use in the present invention.
Figure 12:
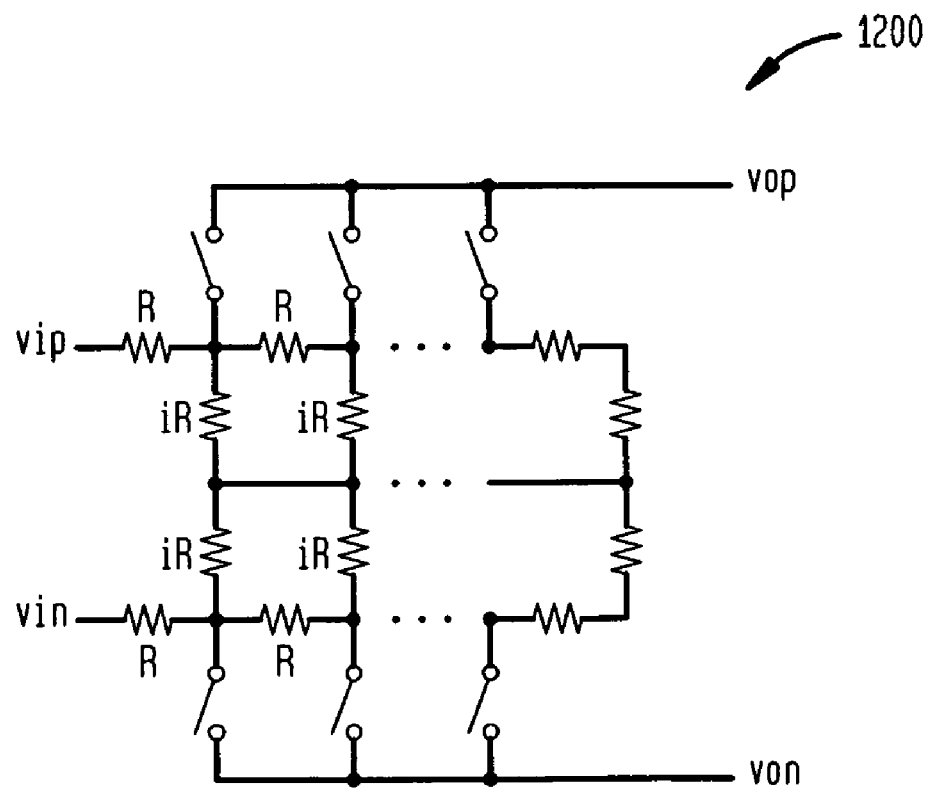
FIG. 12 is a diagram of an example R/iR ladder according to the present invention.

FIG. 3 is a diagram of an example amplifier 302 for use in first stage 102. Amplifier 302 includes a feedback loop 304 comprising an R/iR ladder 306, where "i" is the ratio between resistors 'R' and 'iR'. An example differential R/iR ladder for use in the present invention is illustrated in FIG. 12. R/iR ladder 1200 includes a cascade of resistive dividers 1202 which provide a constant attenuation between the stages. The size of the resistors are selected such that a fixed attenuation is achieved at each stage. The attenuation is usually measured in logarithmic scale, or dB. When the ladder is configured inside a feedback loop with an amplifier, amplification can be achieved instead of attenuation.

R/iR resistive ladder 1200 may also be referred to as a fixed feedback resistor network. A feedback network, also referred to as a closed-loop system, has the benefit of high signal-to-noise ratio (SNR) and linearity. However, a feedback system has lower bandwidth because of the feedback loop. Since the PGA of the present invention needs to have high SNR and linearity, the open-loop approach is not suitable. The bandwidth of the closed-loop amplifier is designed to meet the input signal frequency.

R/iR ladder 306 comprises taps 308–314. Each tap corresponds to a different coarse gain step. In an embodiment, the gain step between the stages is 1 dB. The R/2R ladder of this embodiment provides a linear gain step in logarithmic scale (dB). For a desired gain level, at least one of taps 308–314 is tapped as an output of amplifier 302. In a preferred embodiment, two taps are tapped so that the final gain may be interpolated between the output signals of the taps. When transitioning between amplifiers or between an attenuator and an amplifier, only one tap from each amplifier or attenuator is tapped (e.g., one tap from amplifier 112 and one tap from amplifier 114). Because different nodes can be tapped, the output resistance (gain) increases or decreases according to the tap selected. However, because the overall feedback resistance in R/iR ladder 306 does not change when different taps are selected, the bandwidth of the system remains stable and unchanged. In other words, the resistance within feedback loop 304 is constant. This ensures monotonicity, where any increase in resistance necessarily increases the gain. The gain control is thus reliable over a large bandwidth. Also, since the resistor value, as well as the feedback factor, is unchanged, the open-loop bandwidth is unchanged. Preferably, the amplifier can maintain stability at all gain settings. Typically, the overall bandwidth and monotonicity is characterized by a "closed-loop" response, while the stability of an amplifier is characterized by an "open-loop" response. Thus, the fixed R/iR ladder network in a feedback loop has three advantages—providing programmable gain in logarithmic scale, maintaining monotonicity because the closed-loop bandwidth is unchanged, and maintaining stability because the open-loop bandwidth is unchanged. A feedback amplifier also supplies high linearity and high SNR to the system.

Figure 4:
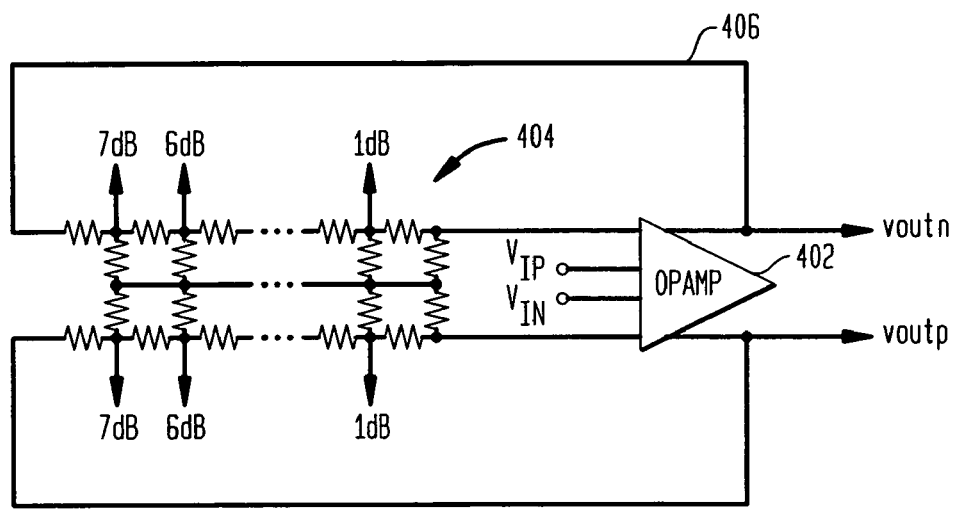
FIG. 4 is a circuit diagram of a differential amplifier system according to an embodiment of the present invention.

FIG. 4 is a circuit diagram of a differential amplifier system 400. In a preferred embodiment of the present invention, differential amplifier system 400 may be used in first stage 102. Differential amplifier system 400 comprises amplifier 402 and resistor ladder 404 in feedback loop 406.

Figure 5:
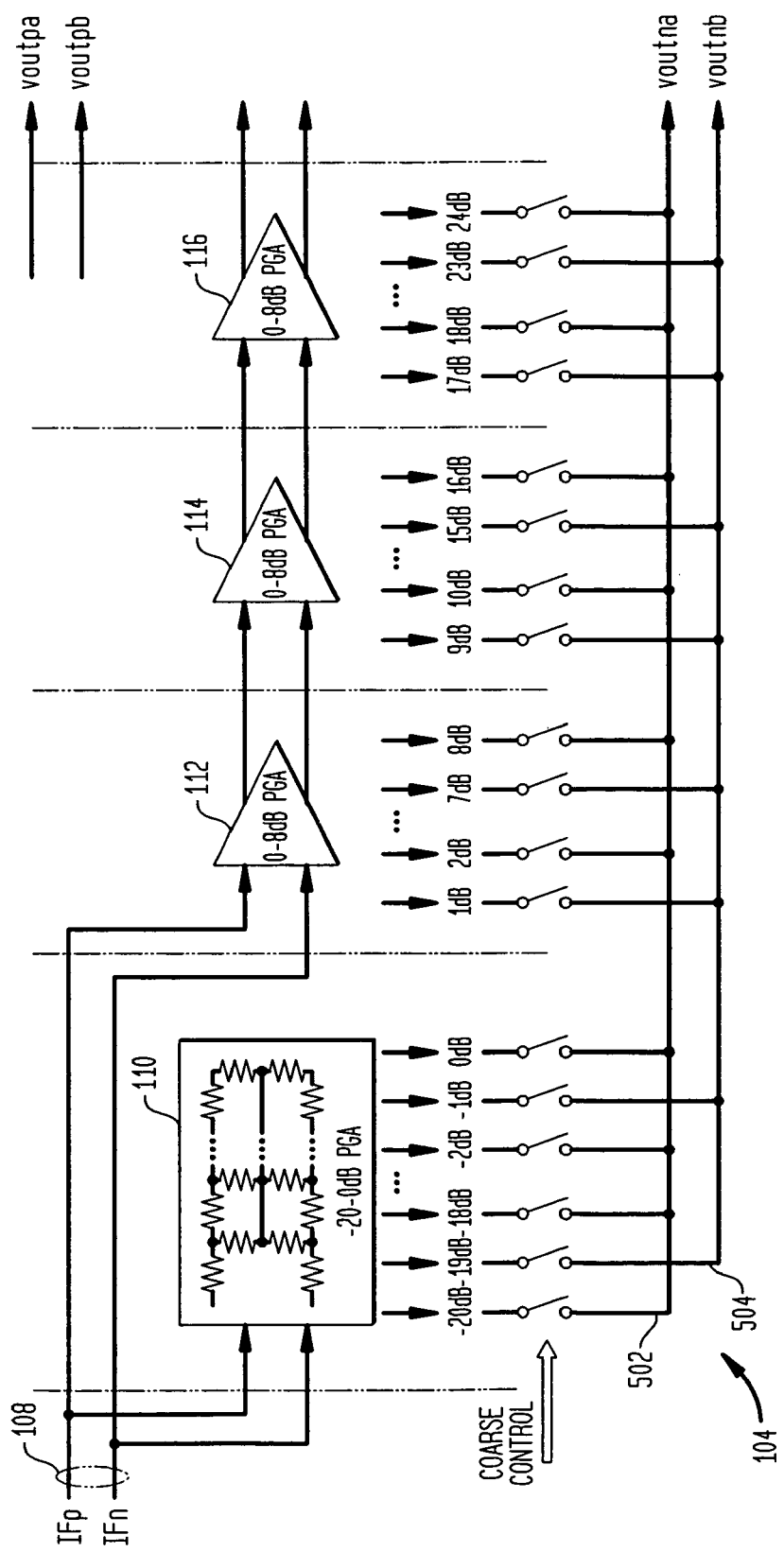
FIG. 5 is a diagram showing the connection between a first stage and plurality of switches used in the present invention.

FIG. 5 is a diagram showing the connection between first stage 102 and plurality of switches 104. Plurality of switches 104 includes a switch set A 502 and a switch set B 504. Switch sets 502 and 504 connect to alternating taps from first stage 102. In one embodiment, only one switch from each of switch set A 502 and switch set B 504 are closed ("on") at any given time. In a preferred embodiment, the two closed switches are adjacent to each other. For instance, if first stage 102 had a step size of 1 dB and a gain of 7.5 dB were desired, a "7" switch on one switch set would be closed, and an "8" switch on the other switch set would be closed. Switch sets 502 and 504 are also connected to the input of second stage 106. As shown in FIG. 5, the output of switch set A 502 is differential, comprising voutna and voutpa. Similarly, the output of switch set B 504 comprises voutnb and voutpb.

Figure 6A:
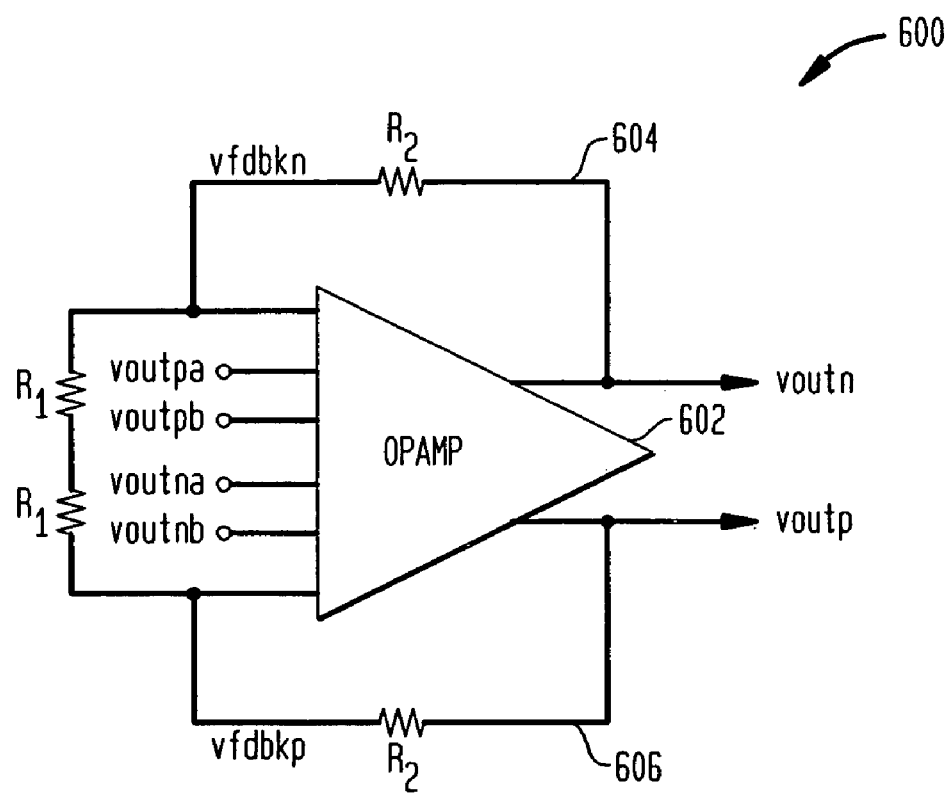
FIGS. 6A and 6B illustrate a differential amplifier that can be used for a second stage of the PGA according to the present invention.

FIG. 6A is a circuit diagram of a differential amplifier 600 that may be used in second stage 106. The amplifier is configured as a non-inverting feedback amplifier with two pairs of differential input signals. An opamp 602 receives gain signals from switch set A 502 and switch set B 504. As with FIG. 5, the differential gain signal from switch set A 502 is shown as voutna and voutpa. The differential gain signal from switch set B 504 is shown as voutnb and voutpb. Differential amplifier 600 also includes first differential feedback loop 604 and second differential feedback loop 606. The final output gain signal is represented by voutn and voutp.

Figure 6B:
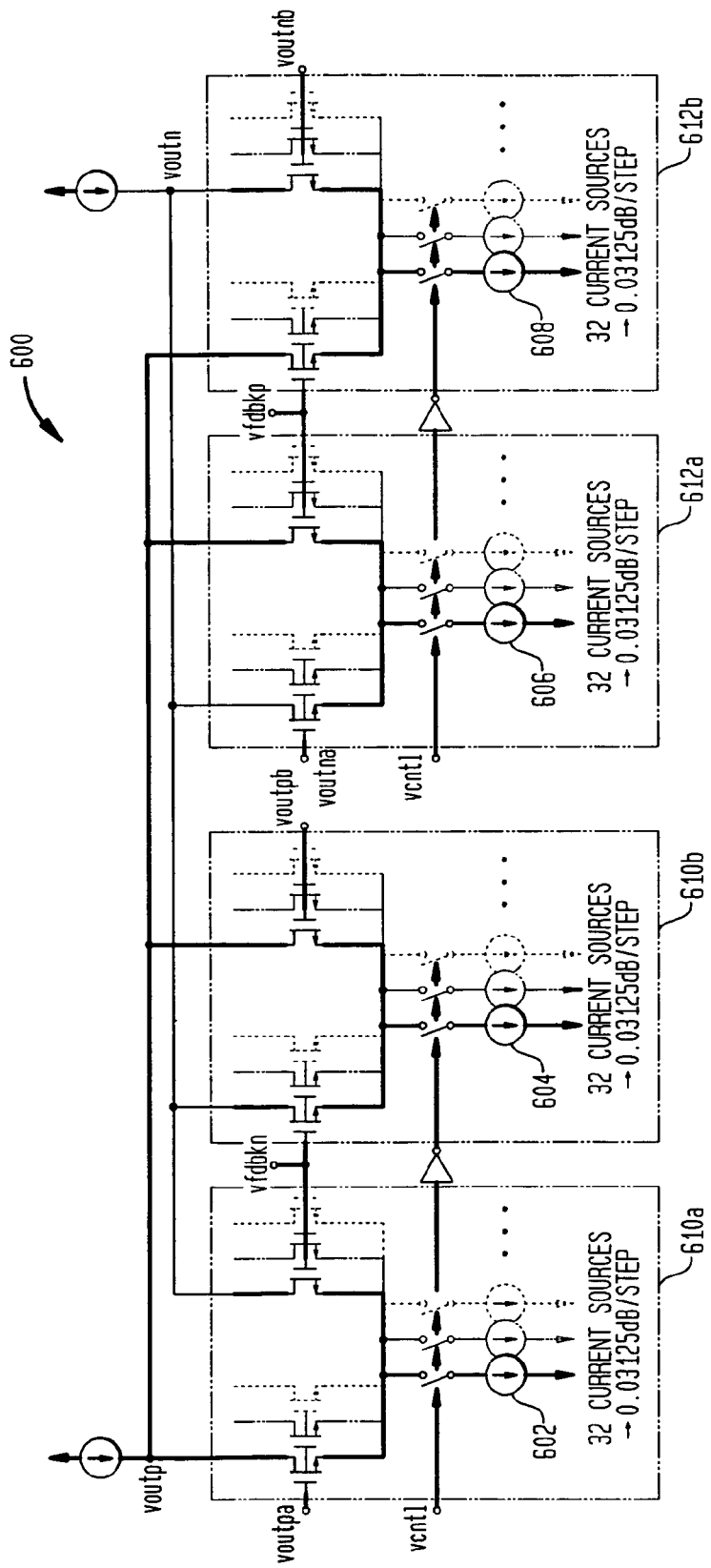

FIG. 6B is a detailed representation of differential opamp 602. In FIG. 6B, the left half of the diagram represents the top half of the diagram in FIG. 6A. Likewise, the right half of the diagram in FIG. 6B represents the bottom half of the diagram in FIG. 6A. As shown in FIG. 6B, the differential outputs of switch sets 502 and 504 are received by respective differential pairs 610a,b and 612a,b. Elements 610a, 610b, 612a, and 612b of the differential pairs amplify and combine respective components of the differential outputs of the switch sets 502 and 504, so that the differential output is a weighted interpolation between the differential outputs of switch sets 502 and 504. More specifically, differential pairs 610a,b and 612a,b are supplied by respective current sources 602–608. Each current source 602–608 includes a plurality of switchable current sources a–n (e.g. 602a–n) so that the respective gain of the differential pairs 610a,b and 612a,b can be incrementally increased or decreased by increasing or decreasing the tail current to the differential pairs.

There is also an inverter (not shown) between the elements 610a and 610b or 612a and 612b. Thus, if the control signal turns on 'x' number of current sources in element 610a, 'x' number of current sources in element 610b turn off. If switch set 502 is connected to voutpa and switch set 504 is connected to voutpb, switch set 502 will have more signal contribution into voutp. By adjusting the relative tail current to the differential amplifiers 610 and 612, the relative contribution from switch sets 502 and 504 in the differential output 614 can be weighted and adjusted, thereby interpolating between the outputs of switch sets 502 and 504.

This interpolation occurs within a feedback loop. Further, since the interpolation occurs at the tail current of the differential pair, which is not in an AC signal path, it will not introduce distortion to the signal, and thus will not degrade linearity. One of skill in the art will recognize that other methods of performing interpolation (e.g., inserting switches in the signal path) may be used without departing from the spirit and scope of the present invention.

Current sources a–n in each of current sources 602–608 can be switched on or off according to a switch matrix, to provide intermediate fine step gains to be set. As each successive current source is turned on, the gain level increases by a set amount. In a preferred embodiment, there are 32 current sources a–n in each of the pluralities of current sources 602–608. The number of current sources N in each plurality 602–608 corresponds to a final gain step size F, in that the final gain step size F is a coarse step size C divided by the number of current sources N, or F=(C/N).

For example, if the outputs from first stage 102 have a 1 dB step size, the use of 32 individual current sources splits the 1 dB step into to 32 smaller steps. This results in a final fine step size of $\frac{1}{32}$ dB, or 0.03125 dB/step. One of skill in the art will recognize that other fine step sizes may be used. In this example, as each current source is turned on, 0.03125 dB is added to the final output gain signal. In this manner, each input gain signal is given a certain weight in the final output gain signal. Since each input gain signal is responsible for a certain percentage of the final output gain signal, and since that percentage contributed can be altered by turning on the appropriate number of current sources corresponding to each input signal, the final output gain can be changed in discrete fine steps. In other words, the interpolation in the output gain signal is derived from a weighting summation of the gain levels output from first stage 102. The total sum of the current sources are also the same (e.g. 32 current sources are "on" at any given time). In this case, the total amount of current to the output remains the same and the circuit behavior of the amplifier will not be changed.

Figure 7A:
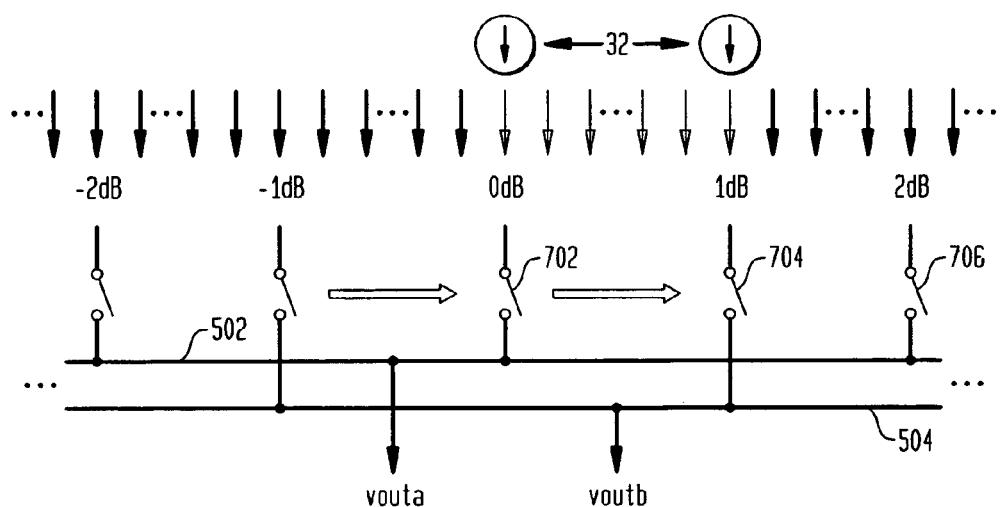
FIG. 7A is a diagram of an example PGA according to the present invention, set for a gain between 0 dB and 1 dB.

For example, FIG. 7A is a diagram of the PGA 100 as it would be set for a gain of 0 dB. In this example, first stage 102 has a step size of 1 dB, and second stage 106 has a step size of $\frac{1}{32}$ dB. A 0 dB switch 702, part of switch set A 502, is closed. All other switches in switch set A 502 remain open. A 1 dB switch 704, part of switch set B 504, is also closed. All other switches in switch set B 504 remain open. Since 0 dB is the desired gain setting, all 32 current sources for switch set A 502 are on. All 32 current sources for switch set B 504 are off, because no gain over 0 dB needs to be added to the signal.

Another example uses a gain setting of 0.03125 dB. Since 0.03125 dB is between 0 dB and 1 dB, the switches corresponding to those levels remain closed. The gain is $\frac{1}{32}$ dB above 0, so 31 current sources for switch set A 502 are on. To increase the gain by ⅓₂ dB, 1 current source for switch set B 504 is on. With this setting, the input from 0 dB switch 702 composes approximately 97% of final output signal 120, and the input from 1 dB switch 704 composes approximately 3% of final output signal 120. All other current sources remain off.

If PGA 100 were set for a gain of 0.0625 dB, 0 dB switch 702 and 1 dB switch 704 would remain closed so that the gain may be interpolated between them. 30 current sources for switch set A 502 are on, composing approximately 94% of output signal 120, while 2 current sources for switch set B 504 are on, composing approximately 6% of output signal 120.

Figure 7B:
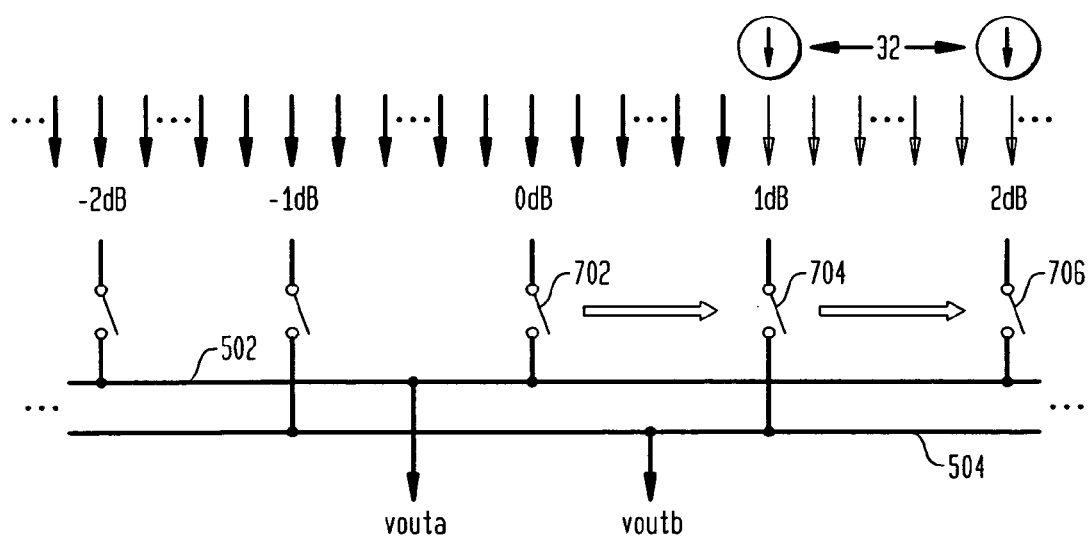
FIG. 7B is a diagram of an example PGA according to the present invention, set for a gain between 1 dB and 2 dB.

FIG. 7B is a diagram of a final example gain setting, where the desired gain is 1 dB. Since gain is increasing in this example, the gain setting moves to the next coarse step. Therefore, 1 dB switch 704 and 2 dB switch 706 are closed. 32 current sources in the switch set connected to 1 dB switch 704 are on, so that the 1 dB switch provides 100% of output signal 120. Since 2 dB switch 706 is not contributing any part of output signal 120, 0 current sources in the switch set connected to 2 dB switch 706 are on.

Increases in gain can be continued in a similar manner as above in, for example, ⅓₂ dB step sizes.

As the gain increases through the series of fine steps, the gain reaches the limit of the coarse step in use. The closed switches in plurality of switches 104 must be updated so that the next coarse step is activated. For example, when the gain in our previous example reaches 1 dB, it is necessary to use the coarse step from 1 dB to 2 dB instead of 0 dB to 1 dB. To increase the coarse step, the switches corresponding to the previous step must be opened, and the switches corresponding to the new step must be closed.

Figure 8A:
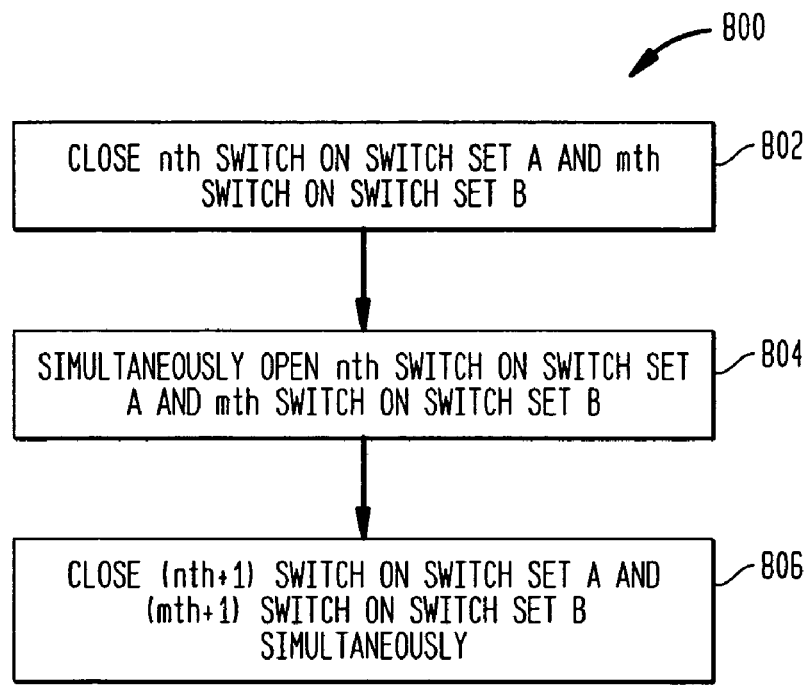
FIG. 8A is a diagram showing one embodiment of a method of switching between gain levels in the present invention.
Figure 8B:
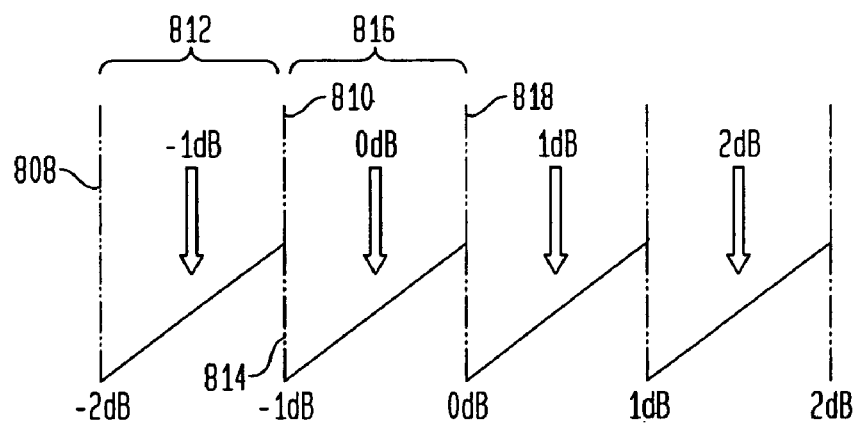
FIG. 8B is a diagram showing the effect on current when one embodiment of a method of switching is used.

FIGS. 8A and 8B are diagrams describing a "sliding" method 800. Method 800 begins with step 802. In step 802, the nth switch of switch set A 502 is closed, as is the mth switch of switch set B 504. The nth and mth switches are, in a preferred embodiment, attached to adjacent taps from first stage 102. The inputs from the nth and mth switches define a first coarse step range.

As the gain approaches the boundaries of the first coarse step range, the amount of gain available from that step becomes limited. When the limit of the first coarse step range is reached, and the step range needs to be updated to the next step, method 800 proceeds to step 804. In step 804, the nth switch of switch set A 502 and the mth switch of switch set B 504 open simultaneously. Method 800 then advances to step 806.

In step 806, the (nth+1) switch of switch set A 502 closes. At the same time, the (mth+1) switch of switch set B 504 closes. The (nth+1) switch of switch set A 502 is, in a preferred embodiment, attached to the same tap to which the mth switch in switch set B 504 was attached (nth+1=mth of prior gain setting). Also, the (nth+1) and (mth+1) switches are attached to two adjacent taps from first stage 102. In this manner, the value of the coarse gain step increases by one coarse gain step to a second coarse gain range. Steps 804 and 806 may be repeated as increased gain levels are needed.

In the above example, for gain settings between 0 dB and 1 dB, 0 dB switch 702 was the only closed switch in switch set A 502. At the same time, 1 dB switch 704 was the only closed switch in switch set B 504. Using sliding method 800, when the gain settings are increased to between 1 dB and 2 dB, switch set A 502 opens 0 dB switch 702 and closes its attachment to 1 dB switch 704. At the same time, switch set B 504 opens its attachment to 1 dB switch 704 and closes 2 dB switch 706. In this fashion, the connection between switch set 106 and first stage 102 appears to "slide" up to the next step. The same method may be used in reverse if the gain is decreasing.

FIG. 8B shows the effect on current when sliding method 800 is used. The solid black line represents the number of currents attached to switch set B 504. For purposes of explanation, −2 dB switch 808 is closed on switch set A 502, and −1 dB switch 810 is closed on switch set B 504 in the initial setup. Referring to coarse step 812, no current sources attached to switch set B 504 are on when the gain is at the low end of the step, shown in this diagram as −2 dB step 808. As the gain increases within coarse step 812 and more fine steps are used, the number of current sources attached to switch set B 504 in use increases as well. When the gain reaches the high end of coarse step 812, shown in this diagram as −1 dB, all current sources attached to switch set B 504 are in use.

When the end of coarse step 812 is reached, and all fine steps within coarse step 812 have been employed, sliding method 800 causes the switches in each of switch sets 502 and 504 to change from the nth and mth positions, respectively, to the (nth+1) and (mth+1) positions, respectively. In this example, the (nth+1) position is at −1 dB switch 810, and the (mth+1) position is at 0 dB switch 818. The number of current sources attaching to switch set B 504 should reset to zero since no current or information should be contributed from 0 dB switch 818. When this change occurs, a glitch 814 can be seen in the current throughput. Glitch 814 results from a period during the transition in which all switches are momentarily open. Furthermore, when sliding method 800 slides from one coarse step to the next, the input signals to differential amplifier 600 are basically swapped. Any systematic mismatch, or random device mismatches in amplifier 600 can cause a glitch or non-monotonicity in the transfer curve. When the gain increase begins in a new coarse step, shown as coarse step 816, gain is at a minimum within coarse step 816 and no current sources attached to switch set B 504 are in use.

Figure 9A:
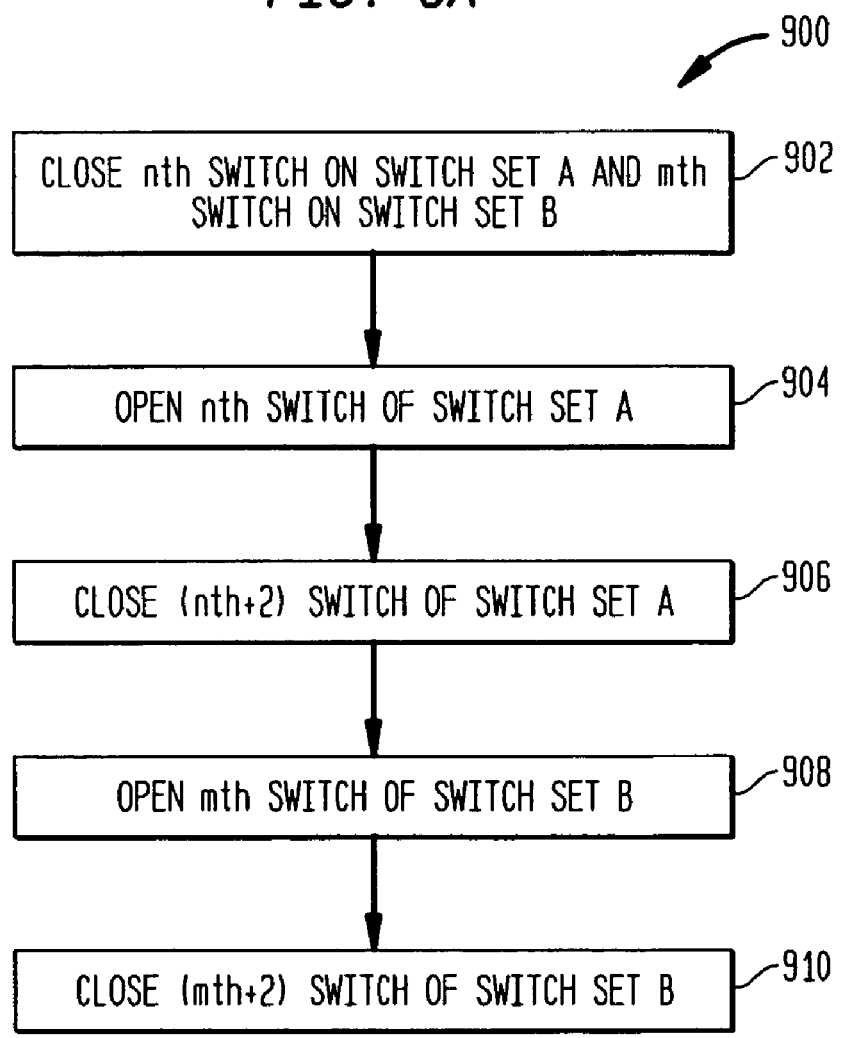
FIG. 9A is a diagram showing a second embodiment of a method of switching between gain levels in the present invention.

FIG. 9A represents "tumbling" method 900. As mentioned above, one problem with sliding method 800 is that, when the switches slide to the next step, a momentary glitch is seen in the output signal. Therefore, in a preferred embodiment tumbling method 900 is used. When the coarse step is increased in tumbling method 900, only one switch set is changed. For successive coarse steps, the switch sets are updated in an alternating manner.

Method 900 begins with step 902. In step 902, the nth switch of switch set A 502 is closed, as is the mth switch of switch set B 504. The nth and mth switches, in a preferred embodiment, are attached to two adjacent taps from first stage 102. They thus define a first coarse step range.

When the limit of the first coarse step range is reached, and the step range needs to be updated to the next step, method 900 proceeds to step 904. In step 904, the nth switch of switch set A 502 opens. However, the mth switch of switch set B 504 remains closed. Method 900 then advances to step 906.

In step 906, the (nth+2) switch of switch set A 502 closes. The mth and (nth+2) switches are, in a preferred embodiment, attached to adjacent taps from first stage 106. Thus, the mth and (nth+2) switches define a second coarse step range.

When the gain within the second coarse step is increased until the limit of the second coarse step range is reached, method 900 proceeds to step 908. In step 908, the mth switch on switch set B 504 opens. However, the (nth+2) switch on switch set A 502 remains closed. Method 900 then advances to step 910.

In step 910, the (mth+2) switch on switch set B 504 closes. The (nth +2) and (mth+2) switches, in a preferred embodiment, are attached to two adjacent taps from first stage 102. In this manner, the (nth+2) and (mth+2) switches define a third coarse step range.

For example, when increasing the gain from between 0 dB and 1 dB to between 1 dB and 2 dB, 1 dB switch 704 remains closed. At the same time, switch set A opens 0 dB switch 702 while closing 2 dB switch 704. The benefit of tumbling method 900 is that at least one switch remains closed at all times. As a result, the transition between coarse steps is smooth and no glitch is inserted into output signal 120.

Steps 904–910 may be repeated as increased gain steps are needed.

Figure 9B:
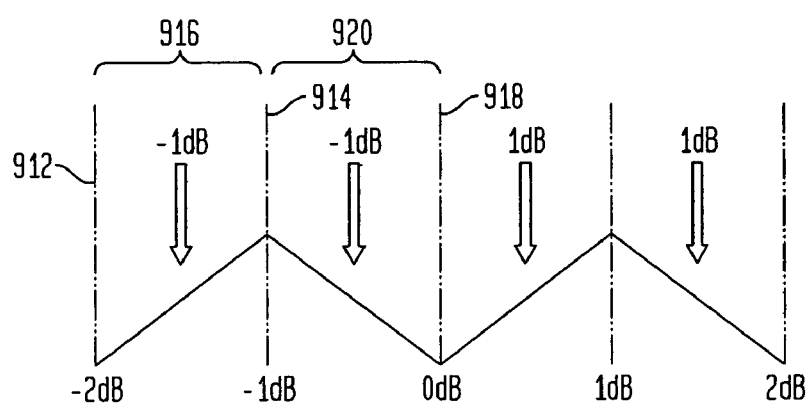
FIG. 9B is a diagram showing the effect on current when the second embodiment of a method of switching is used.

FIG. 9B shows the effect on current when tumbling method 900 is used. The solid black line represents the number of current sources attached to switch set B 504. For purposes of explanation, −2 dB switch 912 is closed on switch set A 502, and −1 dB switch 914 is closed on switch set B 504 in the initial setup. Referring to coarse step 916, no current sources attached to switch set B 504 are on when the gain is at the low end of the step, shown in this diagram as −2 dB. As the gain increases within coarse step 916 and more fine steps are used, the number of current sources attached to switch set B 504 in use increases as well. When the gain reaches the high end of coarse step 916, shown in this diagram as −1 dB, all current sources attached to switch set B 504 are in use.

When the end of coarse step 916 is reached, and all fine steps within the coarse step have been employed, tumbling method 900 causes the switches in only one switch set to change. This leaves the other switch set unchanged. −1 dB switch 914 is used as an example. When a gain of −1 dB is reached, the signal from −2 dB switch 912 is no longer in use and switch set A 502 opens −2 dB switch 912. Instead of simply closing the next switch in line, which would be a −1 dB switch, switch set A 502 skips the −1 dB switch and closes a 0 dB switch 918. No glitches are seen in the current throughput, because the −1 dB switch 914 attached to switch set B 504 remains closed during the transition between coarse steps 916 and 920. When the gain increase begins in a coarse step 920, gain is at a minimum within coarse step 920. This minimum is shown at −1 dB. All current sources attached to switch set B 504 are in use, and the number of current sources attached to switch set B 504 decrease as the gain increases. Tumbling method 900 continues to update the switches in an alternating manner as each new coarse step is reached. The switched signal has a zero weighting in differential amplifier 600 at the moment of switching. Therefore, changing the switch settings has no influence on the output signal.

Figure 10:
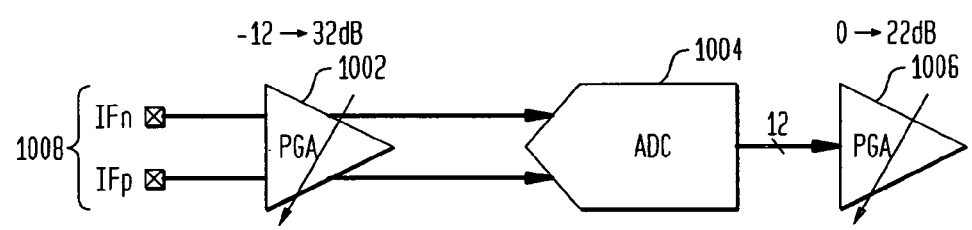
FIG. 10 is a block diagram of an amplification system in which the present invention may be used.

Some applications need an amplifier with a gain range greater than that provided by the amplifier described above. FIG. 10 is a block diagram of an amplification system 1000 in which the amplifier of the present invention may be used. Amplification system 1000 comprises analog PGA 1002, ADC 1004, and digital PGA 1006. Analog PGA 1002 is a PGA according to the above-described invention. An input signal 1008 enters and is amplified by PGA 1002. Signal 1008 then passes through ADC 1004. Signal 1008 can then be amplified digitally by digital PGA 1006 for the remainder of the gain desired. One of the benefits offered by this system is power conservation. In addition, allowing part of the signal to be amplified digitally decreases the complexity of the analog amplification system.

The amount of the signal amplified in the analog domain as compared to the digital domain depends on the resolution of the ADC. If the signal is large, then the signal-to-noise ratio (SNR) of the system will be greater than the SNR of the ADC alone. In a typical system, SNR of the ADC should be the bottleneck of the system noise.

Figure 11:
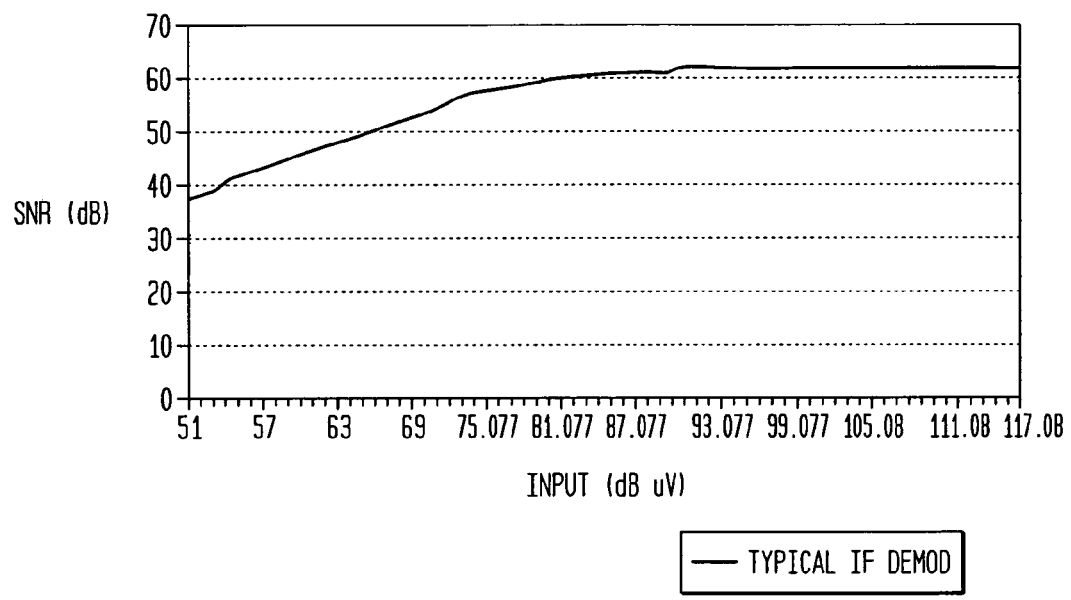
FIG. 11 is a graph of SNR vs. an input signal level representative of the present invention.

FIG. 11 is a graph 1100 showing an example SNR vs. an input signal level in an IF demodulator or a television system. At lower input levels, the system will tolerate a lower SNR, because the signal will be amplified regardless. However, the greater the input signal, the less likely it becomes that amplification will be needed. In this case, a greater SNR is required. For example, in FIG. 11, if the input level is 51 dBuV, system 1000 will tolerate an SNR of approximately 40 dB. As the input signal increases, a greater SNR is required. For an input of 100 dBuV, an SNR of approximately 62 dB is required.

In systems where the signal is amplified before being converted to a digital signal, the noise of the system is usually limited by the SNR of the ADC. For example, assume the present invention is being used in a television system. If the television system is already receiving a very small input signal, the SNR of that input signal is already so low that a 12-bit or 10-bit ADC will only contribute insignificant noise to the input signal. In other words, the full dynamic range of the ADC is not needed. In that case, the input signal can be amplified in the digital domain because the ADC does not limit the SNR.

In a preferred embodiment, ADC 1004 in system 1000 is a 12-bit ADC. The SNR of ADC 1006 is 72 dB, since each bit corresponds to approximately 6 dB. If input signal 1008 is low, for example, 51 dBuV, the system tolerates an SNR of approximately 40 dB. The analog PGA in this embodiment of the invention provides a gain of 40. Therefore, the input of the ADC after amplification with a 51 dBuV input is 40 mV. In a preferred embodiment, a 40 mV input occupies 8 bit resolution, corresponding to 48 dB SNR. Since ADC 1004 has a higher SNR than system 1000, ADC 1004 does not add any further noise and thereby limit the system. Signal 1008 can be amplified in the analog domain to the point where the SNR of ADC 1004 is just above the SNR of system 1000. When that level is reached, ADC 1004 converts signal 1008 to digital. Digital PGA 1006 then amplifies signal 1008 for the remainder of the gain desired.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A programmable gain amplifier, comprising:
   a first amplification stage including a plurality of amplifiers coupled in series;
   a series of taps outputting stepped signals from the plurality of amplifiers, wherein each amplifier is coupled to multiple taps in the series of taps;

a plurality of switches coupled to corresponding taps in the series of taps; and a second amplification stage coupled to the plurality of switches, wherein a given tap in the series of taps, a switch corresponding to the given tap, and the second amplification stage are coupled in series.

2. The amplifier of claim 1, wherein said first amplification stage further comprises:

an attenuator connected in parallel to a first one of the plurality of amplifiers.

3. The amplifier of claim 1, wherein said second amplification stage further comprises a plurality of current sources.

4. The amplifier of claim 3, wherein said plurality of current sources is configured inside a feedback loop.

5. The amplifier of claim 3, wherein:

a closed switch in the plurality of switches transmits to the second amplification stage the corresponding stepped signal to the switch.

6. The amplifier of claim 5, wherein the second amplification stage accepts the output of two switches in the plurality of switches.

7. The amplifier of claim 6, wherein the two switches in the plurality of switches are coupled to two adjacent ones of the series of taps.

8. The amplifier of claim 7, wherein the two adjacent ones of the series of taps are coupled to two adjacent ones of the plurality of amplifiers.

9. The amplifier of claim 8, wherein said second amplification stage is configured to perform an interpolation between the stepped signals from said two adjacent ones of the series of taps.

10. The amplifier of claim 9, wherein said interpolation is a weighting summation.

11. The amplifier of claim 10, wherein a number of the plurality of current sources activated determine a weight of the stepped signals used in the weighting summation.

12. The amplifier of claim 9, wherein said interpolation results in an arbitrary final amplification step size.

13. The amplifier of claim 9, wherein said interpolation results in a final step size of $1/32$ dB.

14. The amplifier of claim 1, wherein said stepped signals output by the series of taps have an arbitrary step size.

15. The amplifier of claim 1, wherein said stepped signals output by the series of taps have a step size of 1 dB.

16. The amplifier of claim 1, wherein the plurality of amplifiers are DC coupled.

17. A programmable gain amplifier, comprising:

a plurality of amplifiers; and a fixed gain amplifier, wherein each one of the plurality of amplifiers includes its own resistor ladder to form a plurality of resistor ladders, each resistor ladder having a tap at each resistor in the resistor ladder, such that each one of the plurality of amplifiers is a variable gain amplifier having fixed load feedback, and wherein said fixed gain amplifier accepts the output of two adjacent taps in the plurality of resister ladders.

18. The amplifier of claim 17, wherein said fixed gain amplifier includes a plurality of current sources for interpolating between said output of said two adjacent taps, and wherein said fixed gain amplifier is configured as a feedback amplifier.

19. The amplifier of claim 17, further comprising:

an attenuator to provide attenuation, wherein said attenuator is connected in parallel to a first one of said plurality of amplifiers.

20. A programmable gain amplifier, comprising:

a first amplification stage including an attenuator;

a series of taps outputting stepped signals from the attenuator;

a plurality of switches coupled to corresponding taps in the series of taps; and a second amplification stage coupled to the plurality of switches, wherein a given tap in the series of taps, a switch corresponding to the given tap, and the second amplification stage are coupled in series.

21. The amplifier of claim 20, wherein said first amplification stage further comprises:

a plurality of amplifiers connected in parallel to the attenuator.

22. An amplification system comprising:

an analog programmable gain amplifier;

an analog-to-digital converter; and a digital PGA, wherein the analog PGA comprises:

a first amplification stage including a plurality of amplifiers coupled in series;

a series of taps outputting stepped signals from the plurality of amplifiers;

a plurality of switches coupled to corresponding taps in the series of taps; and a second amplification stage coupled to the plurality of switches, wherein a given tap in the series of taps, a switch corresponding to the given tap, and the second amplification stage are coupled in series, wherein a signal-to-noise ratio of the ADC is configured so as to not limit the available gain in the amplification system.

23. The amplification system of claim 22, wherein the analog PGA has a gain determined so that the signal-to-noise ratio of the ADC does not limit the available gain in the amplification system.

24. A method of programmable amplification, comprising:

inputting an input signal to a plurality of amplifiers;

choosing two adjacent outputs of the plurality of amplifiers; and interpolating between the two adjacent outputs using a differential amplifier coupled between the two adjacent outputs to produce a final amplification.

25. A method of programmable amplification, comprising:

inputting an input signal to a plurality of amplifiers:

choosing two adjacent outputs of the plurality of amplifiers: and interpolating between the two adjacent outputs to produce a final amplification, wherein said interpolating step further comprises:

inputting said two adjacent outputs to corresponding amplifier inputs;

varying a current through each corresponding amplifier input to produce a weighted output for each corresponding amplifier input; and summing the weighted outputs to produce the final amplification.

26. A method of programmable amplification, comprising:

inputting an input signal to a plurality of amplifiers:

choosing two adjacent outputs of the plurality of amplifiers; and interpolating between the two adjacent outputs to produce a final amplification, wherein inputting an input signal further comprises:

passing said input signal simultaneously through an attenuator and a first one of said plurality of amplifiers.

27. The method of claim 24, wherein each amplifier in the plurality of amplifiers has an amplification step size of 1 dB.

28. The method of claim 24, wherein said interpolating step results in a final amplification step size of $1/32$ dB.

29. The method of claim 24, wherein the two adjacent outputs are 1 dB apart.

30. The method of claim 24, wherein said interpolating step is performed in a feedback loop.

31. A method of amplification comprising:
   receiving an input signal;
   amplifying an input signal using an analog programmable gain amplifier to produce an amplified analog signal, wherein the input signal is input to a plurality of amplifiers, two adjacent outputs of the plurality of amplifiers are chosen, and the amplified analog signal is produced by interpolating between the two adjacent outputs;
   digitizing the amplified analog signal with an analog-to-digital converter to produce a digital signal; and
   amplifying the digital signal with a digital programmable gain amplifier to produce an output signal;
   wherein a gain of the analog programmable gain amplifier is increased until a signal-to-noise ratio of the analog to digital converter begins to decrease a signal-to-noise ratio of the digital output signal.

32. A method of switching between coarse steps of an amplifier comprising:
   closing an nth switch in a first set of switches and an mth switch in a second set of switches, wherein said nth and mth switches correspond to first and second gain levels, respectively;
   interpolating a first output gain between said first and second gain levels until a maximum gain is reached;
   opening said nth and mth switches; and
   closing an (nth+1) switch in said first set of switches and an (mth+1) set of switches in said second set of switches, wherein said (nth+1) and (mth+1) switches correspond to second and third gain levels.

33. The method of claim 32, further comprising:
   interpolating a second output gain between second and third gain levels.

34. A method of switching between coarse steps of an amplifier, comprising:
   closing an nth switch in a first set of switches and an mth switch in a second set of switches, wherein said nth and mth switches correspond to first and second gain levels, respectively;
   interpolating a first output gain between said first and second gain levels until a maximum gain is reached;
   opening said nth switch in said first set of switches; and
   closing an (nth+2) switch in said first set of switches, such that the (nth+2) switch in said first set of switches corresponds to a third gain level.

35. The method of claim 34, further comprising: interpolating a second output gain between said second and third levels.

36. The method of claim 35, further comprising:
   opening said mth switch in said second set of switches; and
   closing an (mth+2) switch in said second set of switches, such that the (mth+2) switch in said second set of switches corresponds to a fourth gain level.

37. The programmable gain amplifier of claim 1, wherein each amplifier of said plurality of amplifiers includes a resistor ladder that forms a feedback loop from an output of said amplifier to an input of said amplifier, each resistor ladder tapped with said series of taps to output said stepped signals.

38. The programmable gain amplifier of claim 37, wherein said resistor ladder provides a fixed resistance from an output of said amplifier to an input of said amplifier.

\* \* \* \* \*